United States Patent
Fukunaga et al.

(10) Patent No.: US 10,312,363 B1
(45) Date of Patent: Jun. 4, 2019

(54) SEMICONDUCTOR DEVICE HAVING IMPROVED EDGE TRENCH, SOURCE ELECTRODE AND GATE ELECTRODE STRUCTURES

(71) Applicant: SANKEN ELECTRIC CO., LTD., Niiza-Shi, Saitama (JP)

(72) Inventors: Shunsuke Fukunaga, Saitama (JP); Taro Kondo, Niiza (JP)

(73) Assignee: SANKEN ELECTRIC CO., LTD., Niiza-Shi (JP)

( * ) Notice: Subject to any disclaimer, the term of this patent is extended or adjusted under 35 U.S.C. 154(b) by 0 days.

(21) Appl. No.: 15/886,953

(22) Filed: Feb. 2, 2018

(51) Int. Cl.
  *H01L 29/78* (2006.01)
  *H01L 29/40* (2006.01)
  *H01L 29/423* (2006.01)

(52) U.S. Cl.
  CPC ........ *H01L 29/7811* (2013.01); *H01L 29/407* (2013.01); *H01L 29/4236* (2013.01); *H01L 29/7813* (2013.01)

(58) Field of Classification Search
  CPC ............... H01L 29/7811; H01L 29/407; H01L 29/4236; H01L 29/7813
  See application file for complete search history.

(56) References Cited

U.S. PATENT DOCUMENTS

| | | | |
|---|---|---|---|
| 8,431,457 B2 * | 4/2013 | Chang | H01L 29/402 438/270 |
| 2010/0140696 A1 | 6/2010 | Yedinak et al. | |
| 2011/0204440 A1 * | 8/2011 | Bhalla | H01L 29/407 257/333 |
| 2014/0264567 A1 * | 9/2014 | Challa | H01L 29/7827 257/330 |
| 2015/0179750 A1 * | 6/2015 | Calafut | H01L 29/42368 438/270 |

* cited by examiner

*Primary Examiner* — David C Spalla
(74) *Attorney, Agent, or Firm* — Metrolexis Law Group, PLLC

(57) ABSTRACT

A semiconductor device may include a device region having one or more active trenches, a field termination region having an edge trench. A depth of the edge trench is larger than a depth of the one or more active trenches. A thickness of an insulation layer in the edge trench is larger than a thickness of an insulation layer in the one or more active trenches. In some embodiments, the first depth is from 1.2 to 2.0 times larger than the second depth, and a first width of the edge trench is 1.5 to 4.0 times larger than a second width of the one or more active trenches. In a cross-sectional view, a gate electrode of the edge trench is laterally offset from the source electrode in a depth direction of the edge trench such that the gate electrode and the source electrode do not overlap.

8 Claims, 6 Drawing Sheets

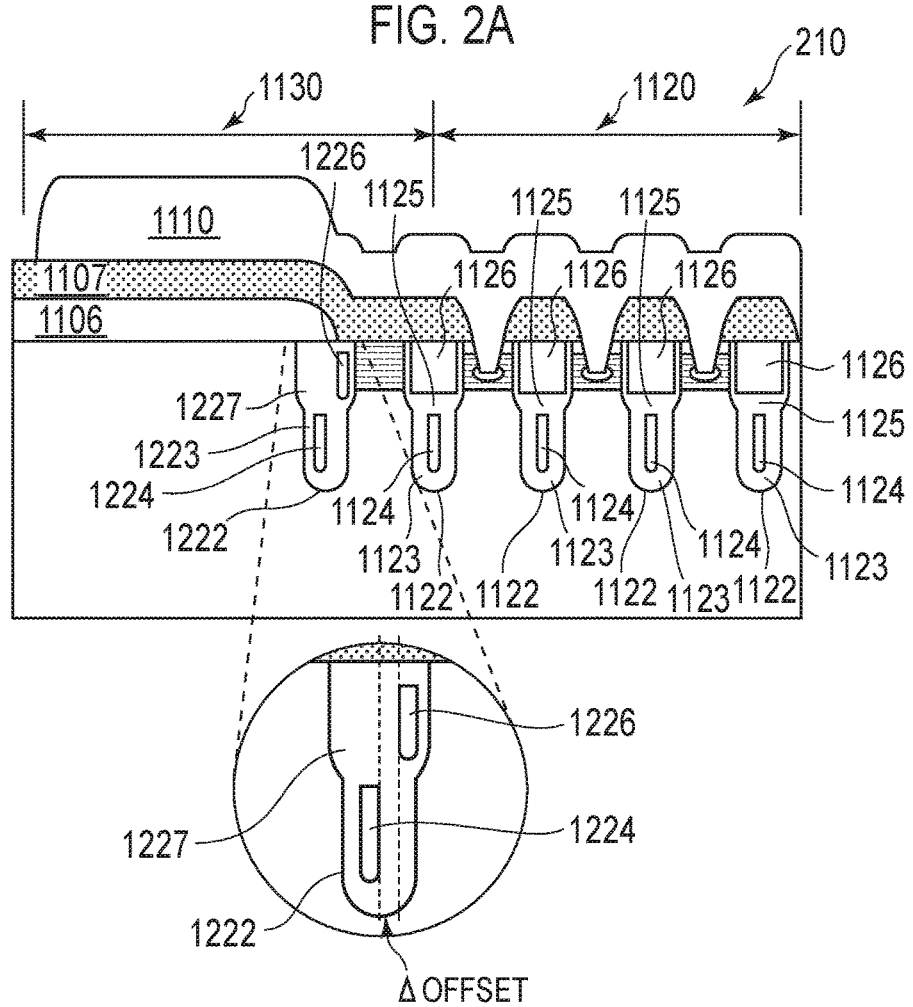
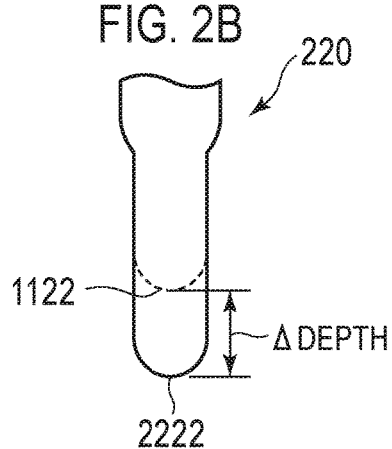
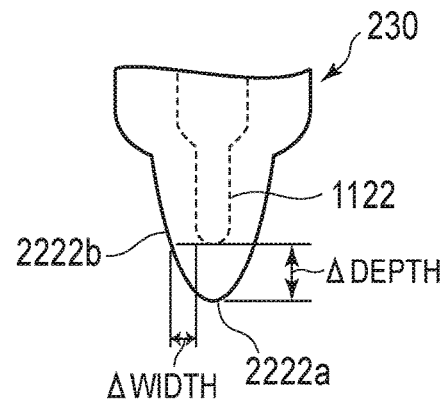

SEMICONDUCTOR DEVICE HAVING IMPROVED EDGE TRENCH, SOURCE ELECTRODE AND GATE ELECTRODE STRUCTURES

BACKGROUND

The present disclosure is generally related to a semiconductor device, and specifically to a semiconductor device having improved edge trench, source electrode and gate electrode structures.

A typical power semiconductor die has an active area where an array of mesas and trenches that implement the device are located, a field termination area around the active area, and an inactive area where interconnects and channel stops may be provided. The field termination area minimizes the electric fields around the active area. The breakdown voltage of the device may be determined by the breakdown processes associated with the active area. However various passive breakdown processes can occur in the field termination area and inactive area at significantly lower voltages. Many designs often require compromises that increase the total die area and cost of the die. A background example may be shown in U.S. Patent Application Publication No. 2010/0140696 ("Patent Literature 1").

In an edge trench, a shield electrode may be formed in which a thickness of an insulating layer facing to an epitaxial side is larger than that in other trenches. Such a design may provide a high withstand voltage. However, problems may arise in that, while higher withstand voltages are desirable, the ability to endure fractures that may occur within the edge trench must be addressed.

SUMMARY

A semiconductor device according to one or more embodiments includes: a device region comprising one or more active trenches, each having a first gate and a first source electrode; a field termination region comprising an edge trench having a second gate electrode and a second source electrode. In one or more embodiments, a first depth of the edge trench is larger than a second depth of the one or more active trenches, and a thickness of a first insulation layer in the edge trench in an area of an epitaxial layer is larger than a thickness of a second insulation layer in the one or more active trenches in the area of the epitaxial layer.

Further in accordance with one or more embodiments, the first depth is from 1.2 to 2.0 times larger than the second depth. Further in accordance with one or more embodiments, a first width of the edge trench is from 1.5 to 4.0 times larger than a second width of the one or more active trenches. Further in accordance with one or more embodiments, in a cross-sectional view, the second gate electrode is laterally offset from the second source electrode in a depth direction of the edge trench such that the second gate electrode and the second source electrode do not overlap in the depth direction. Further in accordance with one or more embodiments, a first material of the first insulating layer is different from a second material of the second insulating layer. Further in accordance with one or more embodiments, the first material comprises $Si_3N_4$ and the second material comprises $SiO_2$. Further in accordance with one or more embodiments, a first pitch between the active trenches and a second pitch between the edge trench and an adjacent one of the active trenches may be set such that the second pitch is from 30% to 70% smaller than the first pitch.

Those skilled in the art will recognize additional features and advantages upon reading the following detailed description, and upon viewing the accompanying drawings.

BRIEF DESCRIPTION OF DRAWINGS

The accompanying drawings, which are incorporated herein and constitute part of this specification, illustrate exemplary embodiments of the invention, and together with the general description given above and the detailed description given below, serve to explain the features of the invention.

FIG. 2A-FIG. 2C are diagrams illustrating cross-sectional views of a semiconductor device configuration of an integrated power semiconductor device having trenches with a gate electrode and a source electrode and an edge trench with a gate electrode and a source electrode having an alignment, having a given depth deeper than in background examples, and having a given width and depth relationship according to one or more embodiments;

DETAILED DESCRIPTION

Figure 1A:
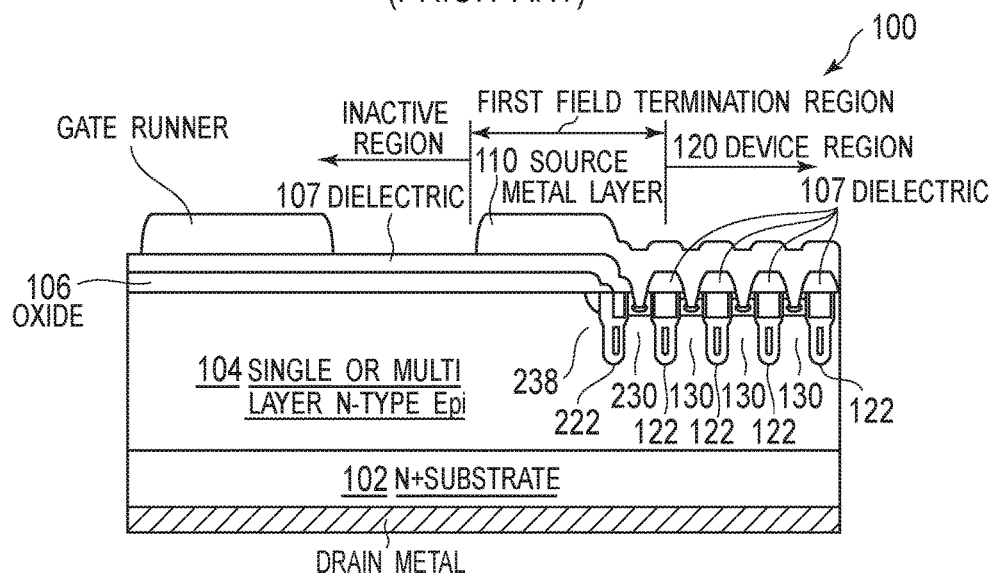
FIG. 1A is a diagram illustrating a cross-sectional view of a semiconductor device configuration of an integrated power semiconductor device having trenches with a gate electrode and a source electrode and an edge trench with a gate electrode and a source electrode according to a background example.

Embodiments are described with reference to drawings, in which the same constituents are designated by the same reference numerals and duplicate explanation concerning the same constituents may be omitted for brevity and ease of explanation. The drawings are illustrative and exemplary in nature and provided to facilitate understanding of the illustrated embodiments and may not be exhaustive or limiting.

Dimensions or proportions in the drawings are not intended to impose restrictions on the disclosed embodiments. For this reason, specific dimensions and the like should be interpreted with the accompanying descriptions taken into consideration. In addition, the drawings include parts whose dimensional relationship and ratios are different from one drawing to another.

Prepositions, such as "on", "over" and "above" may be defined with respect to a surface, for example a layer surface, regardless of the orientation of the surface in space.

Figure 1B:
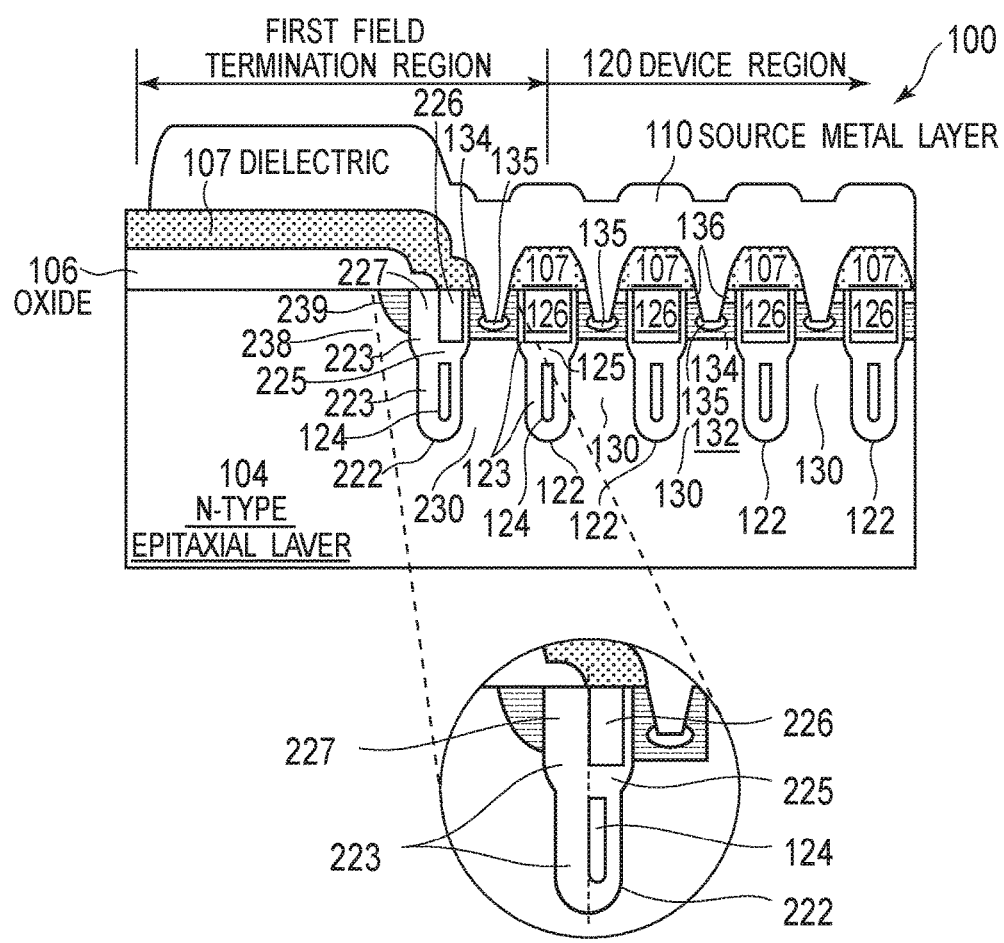
FIG. 1B is a diagram further illustrating a cross-sectional view of a semiconductor device configuration of an integrated power semiconductor device having trenches with a gate electrode and a source electrode and an edge trench with a gate electrode and a source electrode according to a background example.

An integrated power semiconductor device structure of the background art, such as that disclosed in Patent Literature 1, the contents of which are incorporated herein by reference is illustrated in FIG. 1A and FIG. 1B. FIG. 1A is a cross-sectional view of a portion of a die 100 that includes active device region 120 and a first field termination region. The die 100 may comprise an N+doped semiconductor substrate 102, one or more epitaxially grown semiconductor n-type layers 104 disposed on semiconductor substrate 102, an oxide layer 106 disposed over epitaxial semiconductor layer 104 in the inactive and first field termination regions, a dielectric layer 107 disposed over the oxide layer 106, a gate runner disposed over the dielectric layer 107 at the left portion of the inactive region, and conductive layer 110, such as a source metal layer, disposed over dielectric layer 107 in the first field termination region. A semiconductor region may be doped as a p-conductivity type (or "p-type") region with a p-type dopant, or doped as an n-conductivity type (or "n-type") region with an n-type dopant. In device region 120, device 100 further comprises a plurality of trenches 122 disposed in the epitaxial semiconductor layer, and a plurality of mesas 130 of semiconductor material interleaved between trenches 122. Portions of the dielectric layer 107 cover the tops of trenches 122, and the source metal layer 110 extends over active device region 120 and makes contact to mesas 130. The structure of trenches 122 and mesas 130 is described below with reference to FIG. 1B. In the first termination region, device 100 further comprises a first edge trench 222, a first end mesa 230 disposed between first edge trench 222 and the leftmost trench 122 of device region 120, and a second end mesa 238 disposed to the left of first edge trench 222.

FIG. 1B is a magnified cross section view of the first field termination region and device region 120 shown in FIG. 1A. Each trench 122 has opposing sidewalls lined with a dielectric layer 123, a source electrode 124 disposed between the sidewalls near the bottom the trench, a dielectric layer 125 disposed over source electrode 124, and a gate electrode 126 disposed over the dielectric layer and between the trench sidewalls. Each mesa 130 comprises a p-type well 134 disposed in the epitaxial semiconductor layer 104 adjacent to the top surface of layer 104, a pair of source regions 136, which may be n+type, may be disposed in p-well 134 adjacent to two adjacent trenches 122 and the top surface of the epitaxial semiconductor layer 104, and an N-drift region 132 disposed below p-well 134.

A small trench may be formed in the center of mesa 130 to allow the source metal layer 110 to make electrical contact to the source regions 136, and to the p-well 134 at a small region 135 of enhanced p+doping. Electron current may be conducted vertically through the device, from source regions 136, through an inverted region of the p-well 134 adjacent to the gate oxide 123, further through drift region 132, and down to the N+substrate 102 and the drain contact, with the amount of current being modulated by the potential on the gate electrodes 126 in trenches 122 under normal operating conditions. The shield electrodes 124 are electrically coupled to the potential of the source metal layer 110 and source regions 136, and shield the p-well from high electric fields.

When the potential on the gate electrode 126 is set to place the device in an off state (e.g., typically a potential of around zero volts), a substantial current can still flow during a breakdown condition where the drain potential is very high relative to the source potential. In the breakdown condition, high electric fields develop in a region in each mesa 130, and this high electric field generates avalanche carriers (both holes and electrons). The voltage at which this breakdown condition occurs is called the breakdown voltage. The breakdown voltage of the mesa may be raised by selecting the shield oxide thickness, the width of the mesa, and the doping of the N-drift region 132 to cause the N-drift region 132 to be normally depleted of electrons. This causes the electric field during off-state conditions to be more uniformly distributed along the centerline of the mesa (e.g., a square-shaped electric field profile), thereby reducing the peak electric field (and thereby increasing the voltage at which avalanche carriers can be generated). The condition whereby the N-drift region 132 is depleted of electrons is called the "charge-balanced condition." The charge-balanced condition can be generally achieved when the product of the mesa width and the doping of the N-drift region 132 is in the range of $1 \times 10^{11}$ cm$^{-2}$ to $1 \times 10^{13}$ cm$^{-2}$.

In some examples, the breakdown voltage may be determined by the breakdown process associated with the mesa 130. However, due to parasitic breakdown mechanisms that occur in various field termination regions of the device at lower voltages, and the overall breakdown voltage of the device may be effectively set to a lower value than the breakdown process in mesa 130.

In some examples, a parasitic mechanism may occur at the thin portion of dielectric layer 123 in the outermost trench of a device region 120 having a termination region. Without a mesa 130 next to it, the thin dielectric layer would be exposed to the potential of the n-type epitaxial layer, which is coupled to the drain potential. A large electric field may develop across the thin dielectric layer, which can cause a breakdown to occur at a relatively low voltage.

Such a parasitic breakdown mechanism in some examples may be address by disposing an edge trench 222 on either side of the array of active trenches 122 of the device region 120. Trench 222 has opposing sidewalls lined with a dielectric layer 223, a source electrode 124 disposed between the sidewalls near the bottom the trench, a dielectric layer 125 disposed over source electrode 124, and a gate electrode 226 disposed over dielectric layer 223 and between the trench sidewalls. However, unlike the dielectric layer 123 of trench 122, dielectric layer 223 is thicker along the sidewall that faces then-type epitaxial layer than along the side wall that faces the trenches 122 of device region 120, as measured along the depth of gate electrode 226. The thicker region is indicated by reference number 227 in the figure. The thicker dielectric reduces the electric field in the dielectric layer, and thereby increases its breakdown voltage. Trench 222 may have the same width as each of trenches 122, and gate electrode 226 may have a smaller width than gate electrode 126.

With reference to FIG. 1B, the broad mesa 238 on the outside of the edge trench 222 may optionally have a p-type region 239 disposed at its surface, next to dielectric layer 223. P-type region 239 may be directly decoupled from any potential, and left in a floating state, or may be electrically coupled to the source metal layer 110 and the source potential (e.g., it may be grounded). In either case, region 239 reduces the electric fields around the top right corner of broad mesa 238, to eliminate this area as a source of parasitic breakdown mechanism. When electrically coupled to the source potential, p-type region 239 further shields dielectric 223 from the drain potential in area 227. P-type region 239 may be formed during the same process for forming p-wells 134.

The mesa 230 to the right of edge trench 222 may be configured as a p-n diode rather than a MOSFET transistor, in which a p-well 134 and enhanced p+ doping region 135, but no source regions 136. The p-n diode is biased in an off state during normal operations of the MOSFET transistor of device region 120. Mesa 230 provides additional spacing distance between broad mesa 238 and the first active mesa 130. The additional spacing serves to buffer the potential in broad mesa 238 from the first active mesa 130 enabling the electrical characteristics of the first mesa 130 to be substantially the same as the interior mesas 130.

However, with reference to FIG. 1A and FIG. 1B, it can be seen that the gate electrode 226 and the source electrode 124 are aligned such that they overlap each other along a vertical axis. Such an arrangement may still provide disadvantages in terms of sub-optimal breakdown voltage and the like.

First Embodiment

FIG. 2A through FIG. 2C illustrate a cross-sectional view of a power semiconductor device having trenches 1122 and edge trench 1222 in accordance with at least a first embodiment. Except as described in connection with disclosed and illustrated embodiments, the description of FIG. 2A through 2C may be applicable to the subsequent figures and embodiments where the description would be redundant.

FIG. 2A is a cross-sectional view of a portion of a device 210 that includes active device region 1120 and a field termination region 1130. The device 210 may comprise an N+doped semiconductor substrate 1102, one or more epitaxially grown semiconductor n-type layers 1104 disposed on the semiconductor substrate 1102, an oxide layer 1106 disposed over the epitaxial semiconductor layer 1104 in the field termination region 1130, a dielectric layer 1107 disposed over the oxide layer 1106, and conductive layer 1110, such as a source metal layer, disposed over dielectric layer 1107 in the first field termination region. A semiconductor region may be doped as a p-conductivity type (or "p-type") region with a p-type dopant, or doped as an n-conductivity type (or "n-type") region with an n-type dopant. In device region 1120, device 210 further comprises a plurality of trenches 1122 disposed in the epitaxial semiconductor layer, and a plurality of mesas 1130 of semiconductor material interleaved between trenches 1122. Portions of the dielectric layer 1107 cover the tops of trenches 1122, and the source metal layer 1110 extends over active device region 1120 and makes contact to mesas 1130. The structure of trenches 1122 and mesas 1130 is analogous to that described with reference to FIG. 1B and a further description will therefore be omitted for brevity. In the first termination region, device 210 further comprises a first edge trench 1222, a first end mesa 1230 disposed between first edge trench 1222 and the leftmost trench 1122 of device region 1120, and a second end mesa 1238 disposed to the left of first edge trench 1222.

Each of the trenches 1122 has opposing sidewalls lined with a dielectric layer 1123, a source electrode 1124 disposed between the sidewalls near the bottom the trench, a dielectric layer 1125 disposed over source electrode 1124, and a gate electrode 1126 disposed over the dielectric layer and between the trench sidewalls.

As in the background examples, when the potential on the gate electrode 1126 is set to place the device in an off state, a substantial current can still flow during a breakdown condition where the drain potential is very high relative to the source potential. In the breakdown condition, high electric fields develop in a region in each mesa 1130, and this high electric field generates avalanche carriers (both holes and electrons). The voltage at which the breakdown condition occurs is called the breakdown voltage. The breakdown voltage of the mesa may be raised by selecting the shield oxide thickness, the width of the mesa, and the doping of the N-drift region 1132 to cause the N-drift region 1132 to be normally depleted of electrons. Selecting the factors as described, causes the electric field during off-state conditions to be more uniformly distributed along the centerline of the mesa, reducing the peak electric field and increasing the voltage at which avalanche carriers can be generated. The condition whereby the N-drift region 1132 is depleted of electrons is called the "charge-balanced condition." The charge-balanced condition can be generally achieved when the product of the mesa width and the doping of the N-drift region 1132 is in the range of $1 \times 10^{11}$ cm$^{-2}$ to $1 \times 10^{13}$ cm$^{-2}$. However, parasitic breakdown remains a concern at lower voltages.

While parasitic breakdown mechanisms in some examples may be addressed by disposing an edge trench 1222 on either side of the array of active trenches 1122 of the device region 1120, configuration of the electrodes within the edge trench 1222 may provide further advantages. The trench 2222 may have opposing sidewalls lined with a dielectric layer 1223, a source electrode 1124 disposed between the sidewalls near the bottom the trench, a dielectric layer 1125 disposed over source electrode 1124, and a gate electrode 1226 disposed over dielectric layer 1223 and between the trench sidewalls. However, unlike the dielectric layer 1123 of trench 1122, dielectric layer 1223 is thicker along the sidewall that faces the n-type epitaxial layer than along the side wall that faces the trenches 1122 of device region 1120, as measured along the depth of gate electrode 1226. The thicker region is indicated by reference number 1227 in the figure. The thicker dielectric reduces the electric field in the dielectric layer, and thereby increases its breakdown voltage. In some embodiments, the trench 1222 may have the same width as each trench of the trenches 1122, and the gate electrode 1226 may have a smaller width than the gate electrode 1126. However, in alternative or modified embodiments the widths may differ as described in greater detail hereinafter.

In background examples, such as is illustrated in FIG. 1A and FIG. 1B, the gate electrode 226 may overlap the source electrode 224 in a depth direction of the trench 122. However, in one or more embodiments, the gate electrode 1226 and the source electrode 1224 may be vertically/laterally offset by an amount offset such that the gate electrode 1226 and the source electrode 1224 do not overlap in the depth direction of the trench 1222.

With further reference to FIG. 2A, the broad mesa 1238 on the outside of the edge trench 1222 may optionally have a p-type region disposed at its surface, next to dielectric layer 1223. In an optional embodiment, a p-type region, similar to region 239 in the examples in FIGS. 1A and 1B, may be directly decoupled from any potential, and left in a floating state, or may be electrically coupled to the source metal layer 1110 and the source potential. In either case, such a p-type region may reduce the electric fields around the top right corner of broad mesa 1238, to eliminate this area as a source of parasitic breakdown mechanism. When electrically coupled to the source potential, a p-type region may further shield dielectric 1223 from the drain potential in area 1227 and, if present, may be formed during the same process for forming p-wells 1134. However, preferably, the p-type region is omitted.

The mesa 1230 to the right of edge trench 1222 may be configured as a p-n diode rather than a MOSFET transistor, in which a p-well 1134 and enhanced p+ doping region 135, but no source regions 1136. The p-n diode is biased in an off state during normal operations of the MOSFET transistor of device region 1120. Mesa 1230 provides additional spacing distance between broad mesa 1238 and the first active mesa 1130. The additional spacing serves to buffer the potential in broad mesa 1238 from the first active mesa 1130 enabling the electrical characteristics of the first mesa 1130 to be substantially the same as the interior mesas 1130.

FIG. 2B and FIG. 2C illustrate a cross-sectional view showing modifications of at least a first embodiment in which in an example 220, a depth of the edge trench 1222 may be set to a depth 2222 representing an offset $\Delta_{depth}$ relative to the depth of one or more of the trenches 1122. In still further modified or alternative embodiments, in an example 230, the depth and the width of the edge trench 1222 may be set to a depth 2222a and a width 2222b relative to the depth and width of one or more of the trenches 1122.

Second Embodiment

Figure 3A:
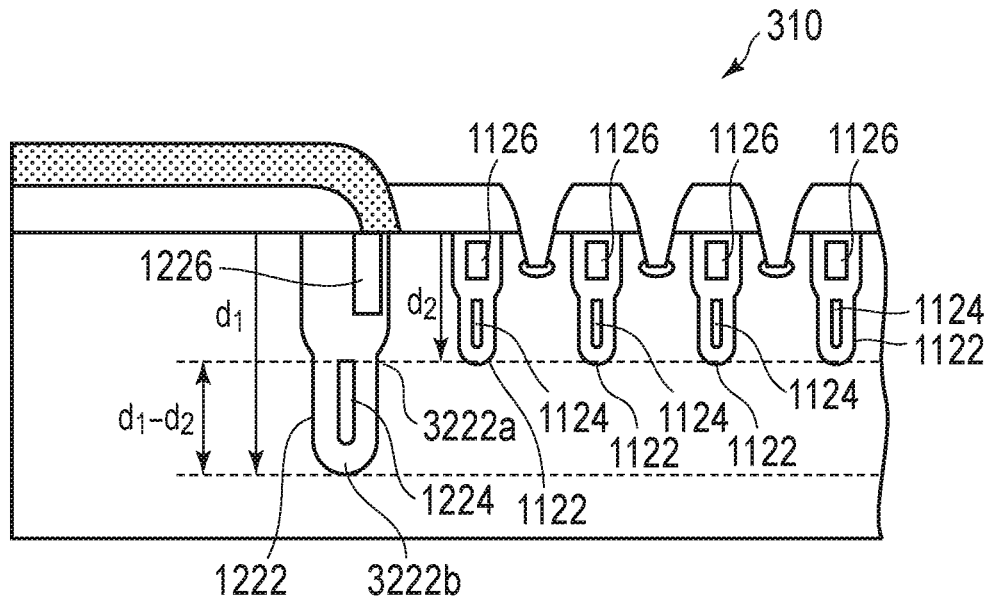
FIG. 3A is a diagram illustrating a cross-sectional view of an integrated power semiconductor device having trenches with a gate electrode and a source electrode and an edge trench with a gate electrode and a source electrode and an edge trench configuration having different depth relationships according to one or more embodiments.
Figure 3B:
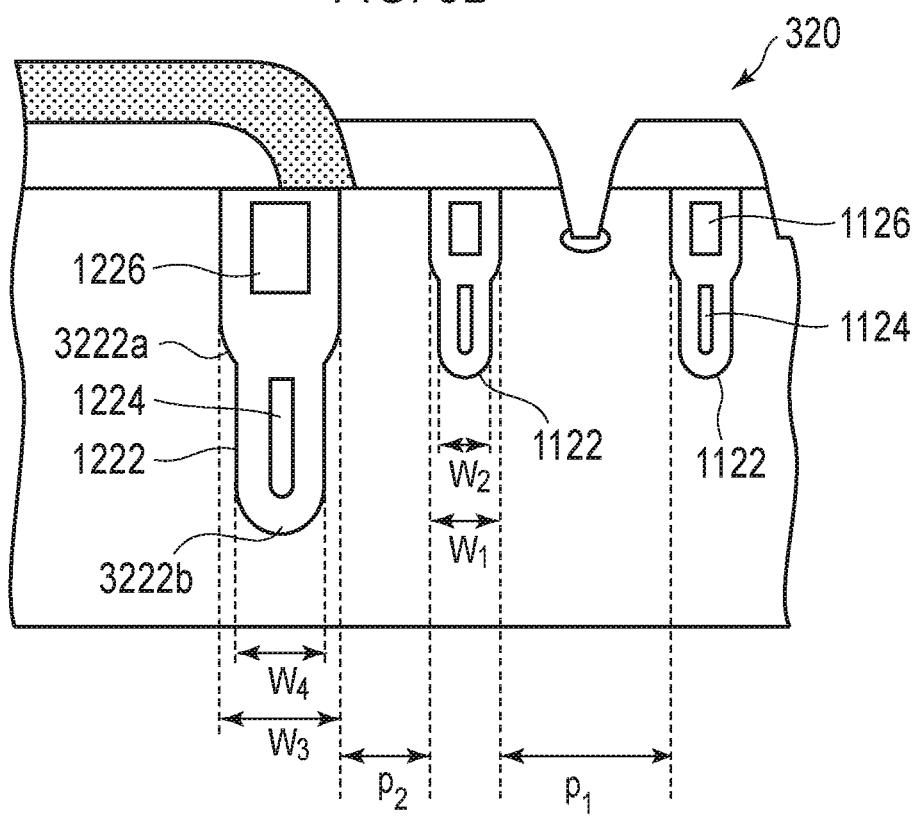
FIG. 3B is a diagram illustrating a cross-sectional view of an integrated power semiconductor device having trenches with a gate electrode and a source electrode and an edge trench with a gate electrode and a source electrode and an edge trench configuration having different width relationships according to one or more embodiments.

FIG. 3A and FIG. 3B illustrate a cross-sectional view of a power semiconductor device having trenches 1122 and edge trench 1222 in accordance with at least a second embodiment. A first embodiment and a second embodiment may differ in that, in a device 310, shown in FIG. 3A, a relationship may be established such that the depth of the edge trench 1222 may be set at d1 and the depth of the trenches 1122 may be set to d2. A distance between a top portion 3222a of the edge trench 1222, which is set to the total depth of the trenches 1122 (e.g. d2), and a bottom portion 3222b of the edge trench 1222 may be set as d1-d2. The top portion 3222a and the bottom portion 3222b may represent the portion of the edge trench 1222 that houses the source electrode 1224. The relationship may be set depending on the breakdown characteristics, such as breakdown voltage that is desired.

In a device 320, shown in FIG. 3B, alternatively, or in addition to setting the depths d1 and d2 corresponding to the top portion 3222a and the bottom portion 3222b of the edge trench 1222, a relationship between a width w1 of portions of the trenches 1122 housing the gate electrodes 1126 and a width w2 of portions of the trenches 1122 housing the source electrodes 1124, including a ratio between w1 and w2, may be set to achieve a gate-source characteristic. Further, a width w3 of a portion of the edge trench 1222 housing the gate electrode 1226 and a width w4 of a portion of the edge trench 1222 housing the source electrode 1224, including a ratio between w3 and w4, may be set to achieve a gate-source relationship. Further, in at least some embodiments, the relationship, including a ratio between the respective widths of the trenches 1122 and the edge trench 1222 may be set to achieve electrical characteristics between the trenches. Further in at least some embodiments, a relationship between a pitch $p_1$ between trenches 1122 and a pitch $p_2$ between the last trench 1122 and the edge trench 1222 may be established. In at least some embodiments, the relationship between $p_1$ and $p_2$ may be established whereby $p_2$ is from 30% to 70% smaller than $p_1$.

Third Embodiment

Figure 4:
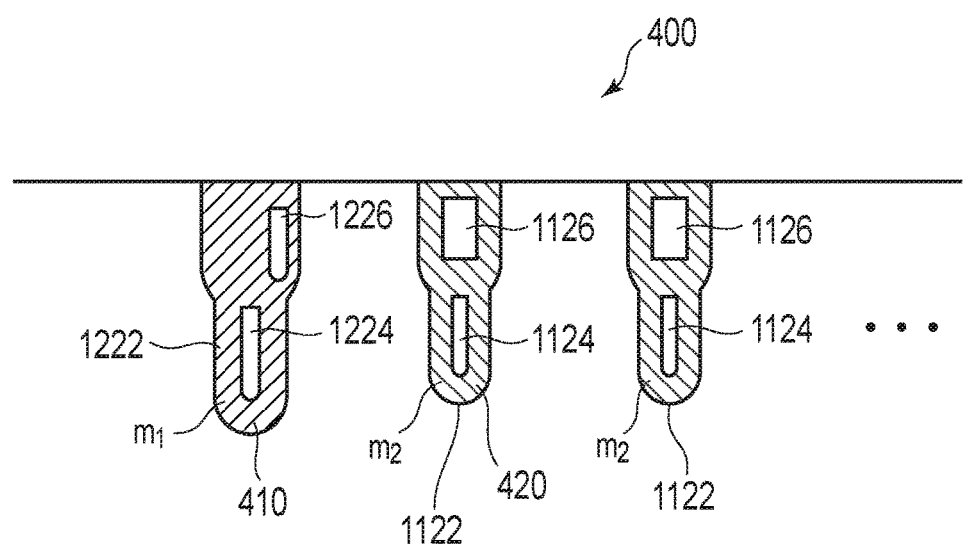
FIG. 4 is a diagram illustrating a cross-sectional view of an integrated power semiconductor device die having trenches with a gate electrode and a source electrode and an edge trench with a gate electrode and a source electrode and an edge trench configuration having different materials according to one or more embodiments.

FIG. 4 illustrates a cross-sectional view of a power semiconductor device having trenches 1122 and edge trench 1222 in accordance with at least a third embodiment. A third embodiment may be combined with other embodiments in that in an example 400, an insulating material 410 may be used to fill the edge trench 1222 and an insulating material 420, different from the material 410 may be used to fill the trenches 1122. In at least some embodiments, the first material m1 410 may be silicon nitride ($Si_3N_4$) and the second material m2 420 may be silicon dioxide ($SiO_2$).

Fourth Embodiment

Figure 5A:
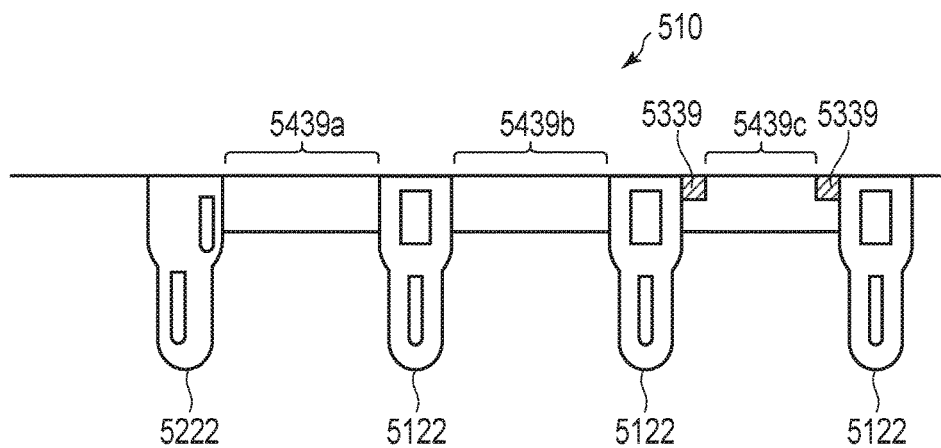
FIG. 5A and FIG. 5B are diagrams illustrating a cross-sectional view of an integrated power semiconductor device having trenches with a gate electrode and a source electrode and an edge trench with a gate electrode and a source electrode and an edge trench configuration having different inter-trench spacings according to one or more embodiments.
Figure 5B:
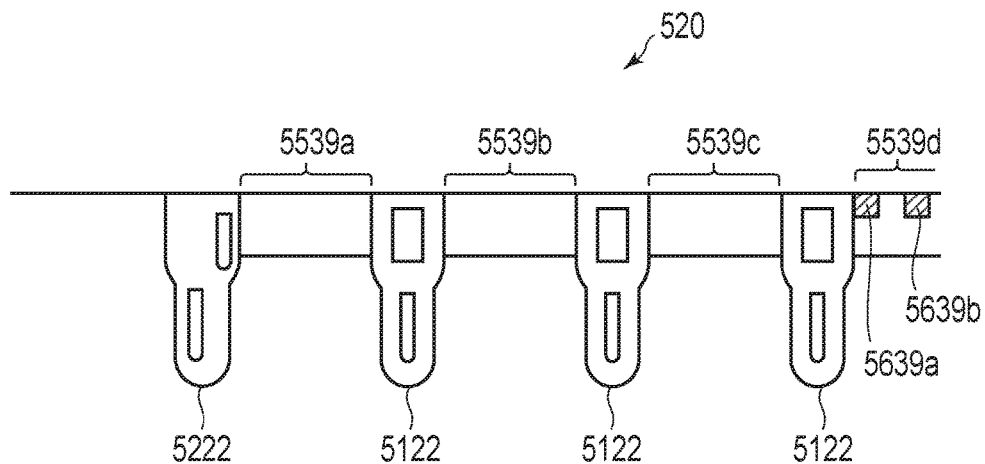

FIGS. 5A and 5B illustrates a cross-sectional view of a power semiconductor device having trenches 5122 and edge trench 5222 in accordance with at least a fourth embodiment. A fourth embodiment may be combined with other embodiments in that in examples 510 and 520 shown in FIG. 5A and FIG. 5B, different spacing may be established between the trenches 5122, floating p-type regions 5339a, 5339b; 5639a, 5639b may be provided.

As shown in FIG. 5A, spacings 5439a, 5439b, 5439c, . . . may be provided between the edge trench 5222, the first of trenches 5122, and subsequent spacings between trenches 5122. In some embodiments, the spacings may be accompanied by additional floating p-type regions 5339a and 5339b to perform similar shielding functions. The size of spacings 5439a, 5439b, 5439c, . . . may increase moving away from the edge trench 5222 and the field termination region toward the device region.

Similarly, as shown in FIG. 5B, spacings 5539a, 5539b, 5539c, . . . may be provided between the edge trench 5222, the first of trenches 5122, and subsequent spacings between trenches 5122. In some embodiments, the spacings may be accompanied by additional floating p-type regions 5639a and 5639b to perform similar shielding functions. The size of spacings 5539a, 5539b, 5539c, . . . may decrease moving away from the edge trench 5222 and the field termination region toward the device region.

The invention includes other embodiments in addition to the above-described embodiments without departing from the spirit of the invention. The embodiments are to be considered in all respects as illustrative, and not restrictive. The scope of the invention is indicated by the appended claims rather than by the foregoing description.

Hence, all configurations including the meaning and range within equivalent arrangements of the claims are intended to be embraced in the invention.

The invention claimed is:

1. A semiconductor device, comprising:
    a device region comprising one or more active trenches, each having a first gate electrode and a first source electrode separated from each other in a depth direction of the one or more active trenches; and
    a field termination region comprising an edge trench having a second gate electrode and a second source electrode separated from each other in a depth direction of the edge trench, wherein
    a first depth of the edge trench is larger than a second depth of the one or more active trenches,
    a thickness of a first insulation layer between the second gate electrode and an epitaxial layer in the edge trench is larger than a thickness of a second insulation layer between the first gate electrode and the epitaxial layer in the one or more active trenches, and in a cross-sectional view, the second gate electrode is laterally offset from the second source electrode in the depth direction of the edge trench such that the second gate electrode and the second source electrode do not overlap in the depth direction.

2. The semiconductor device according to claim 1, wherein the first depth is from 1.2 to 2.0 times larger than the second depth.

3. The semiconductor device according to claim 1, wherein a first width of the edge trench is from 1.5 to 4.0 times larger than a second width of the one or more active trenches.

4. The semiconductor device according to claim 1, wherein a first material of the first insulating layer is different from a second material of the second insulating layer.

5. The semiconductor device according to claim 4, wherein the first material comprises $Si_3N_4$ and the second material comprises $SiO_2$.

6. A semiconductor device, comprising:
a device region comprising one or more active trenches, each having a first gate electrode and a first source electrode separated from each other in a depth direction of the one or more active trenches; and
a field termination region comprising an edge trench having a second gate electrode and a second source electrode separated from each other in a depth direction of the edge trench, wherein
a first depth of the edge trench is larger than a second depth of the one or more active trenches,
a thickness of a first insulation layer between the second gate electrode and an epitaxial layer in the edge trench is larger than a thickness of a second insulation layer between the first gate electrode and the epitaxial layer in the one or more active trenches, and
a first pitch between the active trenches and a second pitch between the edge trench and an adjacent one of the active trenches is set such that the second pitch is from 30% to 70% smaller than the first pitch.

7. The semiconductor device according to claim 6, wherein a first material of the first insulating layer is different from a second material of the second insulating layer.

8. The semiconductor device according to claim 7, wherein the first material comprises $Si_3N_4$ and the second material comprises $SiO_2$.

* * * * *